United States Patent
Monroy Aguirre et al.

(10) Patent No.: US 9,847,349 B1
(45) Date of Patent: Dec. 19, 2017

(54) BIASING THE SUBSTRATE REGION OF AN MOS TRANSISTOR

(71) Applicant: STMicroelectronics SA, Montrouge (FR)

(72) Inventors: Augustin Monroy Aguirre, St. Martin d'heres (FR); Guillaume Bertrand, Saint Martin d'heres (FR); Philippe Cathelin, Laval (FR); Raphael Paulin, Le Versoud (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/463,493

(22) Filed: Mar. 20, 2017

(30) Foreign Application Priority Data

Sep. 19, 2016 (FR) ..................................... 16 58771

(51) Int. Cl.
*H01L 27/12* (2006.01)
*H01L 29/08* (2006.01)
*H01L 29/45* (2006.01)
*H01L 23/528* (2006.01)
*H01L 29/06* (2006.01)
*H01L 29/10* (2006.01)

(52) U.S. Cl.
CPC ........ *H01L 27/1203* (2013.01); *H01L 23/528* (2013.01); *H01L 29/0649* (2013.01); *H01L 29/0847* (2013.01); *H01L 29/1079* (2013.01); *H01L 29/1095* (2013.01); *H01L 29/456* (2013.01)

(58) Field of Classification Search
CPC ............... H01L 27/1203; H01L 23/528; H01L 29/0649; H01L 29/0847; H01L 29/1079; H01L 29/1095; H01L 29/456

USPC .......................................................... 257/347
See application file for complete search history.

(56) References Cited

U.S. PATENT DOCUMENTS

| | | | |
|---|---|---|---|
| 5,317,181 A | 5/1994 | Tyson | |
| 6,154,091 A | 11/2000 | Pennings et al. | |
| 6,281,593 B1 * | 8/2001 | Brown | H01L 21/76243 257/213 |

FOREIGN PATENT DOCUMENTS

WO    WO-0148828 A1    7/2001

OTHER PUBLICATIONS

INPI Search Report and Written Opinion for FR 1658771 dated May 26, 2017 (7 pages).
Chapter 5: Layout for SOI, found at http://link.springer.com/chatper/10.1007/0-306-48161-8_5, Copyright 2002 (2 pages).

* cited by examiner

*Primary Examiner* — Tu-Tu Ho
(74) *Attorney, Agent, or Firm* — Gardere Wynne Sewell LLP

(57) ABSTRACT

An integrated electronic device is supported by a substrate of a silicon on insulator type. At least one transistor is formed in and on a semiconductor film of the substrate. The transistor includes a drain region and a source region of a first conductivity type and a substrate (body) region of a second conductivity type lying under a gate region. An extension region laterally continues the substrate (body) region beyond the source and drain regions and borders, in contact with, the source region through a border region having the first conductivity type. This supports formation of an electrical connection of the source region and the substrate (body) region.

18 Claims, 3 Drawing Sheets

BIASING THE SUBSTRATE REGION OF AN MOS TRANSISTOR

PRIORITY CLAIM

This application claims the priority benefit of French Application for Patent No. 1658771, filed on Sep. 19, 2016, the disclosure of which is hereby incorporated by reference in its entirety.

TECHNICAL FIELD

Embodiments relate to integrated circuits, and more particularly to metal oxide semiconductor (MOS) transistors formed on a substrate of the silicon on insulator (SOI) type, particularly of the partially depleted silicon on insulator (PDSOI) type, and more particularly to improvement of the performance of this type of transistor.

BACKGROUND

Generally, it is possible to improve the performance of a transistor by biasing its substrate region. For example, biasing the substrate region of a transistor makes it possible to modulate the threshold voltage of the transistor.

As is well known, a substrate of the SOI type generally comprises a carrier substrate lying below a buried insulating layer (commonly referred to by the term buried oxide (BOX), itself lying below a semiconductor film, typically of silicon.

In certain cases, the silicon film may be fully depleted, in which case the substrate is referred to as being of the fully depleted silicon on insulator (FDSOI) type.

In other cases, the silicon film may be partially depleted, in which case the substrate is referred to as being of the partially depleted silicon on insulator (PDSOI) type.

Irrespective of the type of SOI substrate, the substrate region (or more simply "substrate" or "body") of the transistor lies in the semiconductor film of the SOI substrate type.

In the case of a substrate of the PDSOI type, the substrate (body) of the transistor may be floating or may be electrically connected so that it can be biased.

In certain analog applications, it is particularly advantageous to have good control of the substrate (body) of the transistor.

There are solutions for biasing the substrate of a transistor formed on a substrate of the silicon on insulator type, particularly of the PDSOI type, such as forming a contact on a region of the semiconductor film which extends beyond the gate region of the transistor.

However, this type of solution has drawbacks. On the one hand, the contact is capable of generating parasitic effects, for example parasitic capacitances and resistances. On the other hand, the formation of a specific contacting zone for the substrate is not advantageous in terms of the surface occupancy and the design of the integrated circuit, particularly as regards the interconnections.

The formation of a contacting zone on a region of the semiconductor film which extends beyond the gate region hinders the formation of the gate contacting zones symmetrically on either side of the gate line. This type of arrangement, however, allows uniform biasing of the gate region.

A good compromise for controlling the potential of the substrate (body) of the transistor is to use a transistor whose source and substrate are connected. This is referred to as a "tied body", which is used commonly by the person skilled in the art and avoids the drawback of a floating substrate.

In this tied body context, as illustrated in FIG. 1, one existing solution for reducing the number of contacting zones consists of a transistor T comprising a region R, which is in this case p-doped, formed in its source region RS, which is in this case n-doped, in contact with the substrate region, which is in this case p-doped.

Thus, biasing of the source region RS, conventionally by means of contact C formed thereon, also makes it possible to bias the substrate without having to form a specific contact.

However, this solution is not compatible with transistors of smaller dimensions, for example transistors produced in a 0.13 micrometer technology.

This is because the existing implantation technologies do not make it possible to form the p-doped region R in the source region RS without encroaching under the drain region RD. Moreover, this would risk greatly degrading the transistor during its operation.

SUMMARY

Thus, one embodiment provides a transistor comprising a substrate region capable of being biased without producing a specific contacting zone, therefore having simplified routing of the interconnections, reduced parasitic effects, and being compatible with a 0.13 micrometer technology or smaller.

One aspect provides an integrated electronic device comprising a substrate of the silicon on insulator type having a semiconductor film arranged on a buried insulating layer, the device having at least one transistor arranged in and on the semiconductor film, the transistor having a drain region and a source region of a first conductivity type, a film region (forming the substrate region of the transistor) being of a second conductivity type and lying under a gate region, and contacting zones on the source, gate and drain regions.

According to one general characteristic of this aspect, the transistor furthermore comprises an extension region laterally continuing the film region beyond the source and drain regions and bordering, in contact, the source region by a border region having the first conductivity type so as to electrically couple the source region and the substrate region.

Thus, the formation of at least one contact on the source of the transistor makes it possible, in combination with the specific architecture (layout) including this extension region which borders, in contact, the source region, to bias the source and the substrate region simultaneously without forming an additional contacting zone which would require the production of specific interconnections, and to do so while being compatible with advanced technologies, for example 130 nm or smaller.

The extension region comprises, for example, a connecting part of the same conductivity type as the substrate region, connecting the substrate region to the border region, and an electrically conductive region at least partially covering the border region and the connecting part.

The electrically conductive region may comprise a metal silicide with a very low resistivity, for example of less than $5 \times 10^{-5}$ ohm-centimeters.

The connecting part may have a first portion laterally continuing the substrate region and a second portion extending perpendicularly to the first portion and contacting the border region.

According to one embodiment, the device may comprise at least one pair of transistors, the second portions of the connecting parts of each transistor of the at least one pair of transistors extending towards one another from their respective first portion so as to form a common second connecting portion, the device furthermore comprising a common border region to the two transistors, extending from the common second connecting portion and bordering, in contact, the source regions of the two transistors, so as to electrically couple the source regions of the two transistors and their substrate regions.

The device may comprise a plurality of transistors, the gates of the transistors being mutually electrically coupled by gate material lines extending perpendicularly to the gate regions of the transistors, on either side of each transistor.

It would also be possible to connect the gates of the transistors by metal levels lying in the interconnection part of the circuit. This interconnection part is conventionally known by the acronym BEOL (Back End Of Line). These gate material regions may receive contacts making it possible to bias the gates of the transistor, and therefore advantageously allow greater flexibility in the production of the interconnections.

BRIEF DESCRIPTION OF THE DRAWINGS

Other advantages and characteristics of the invention will become apparent on studying the detailed description of entirely non-limiting embodiments, and the appended figures in which.

DETAILED DESCRIPTION

Figure 1:
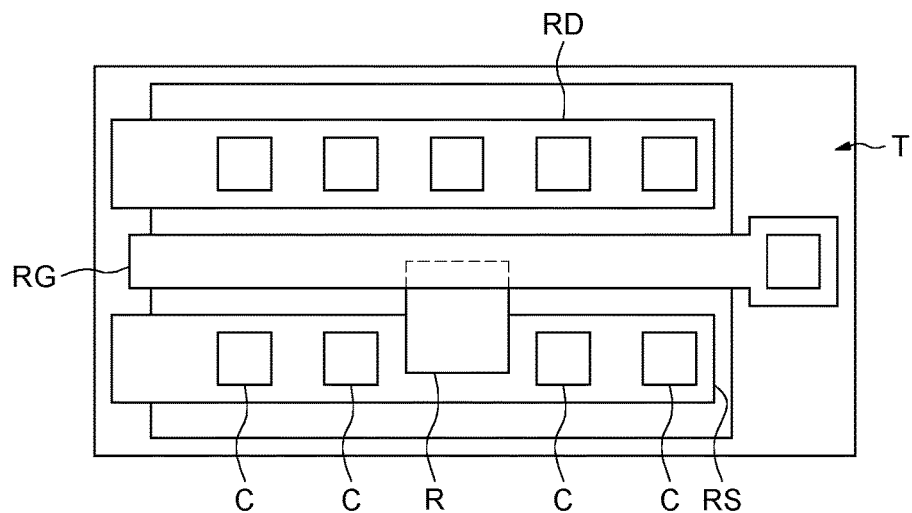
FIG. 1, described above, illustrates the prior art.
Figure 2:
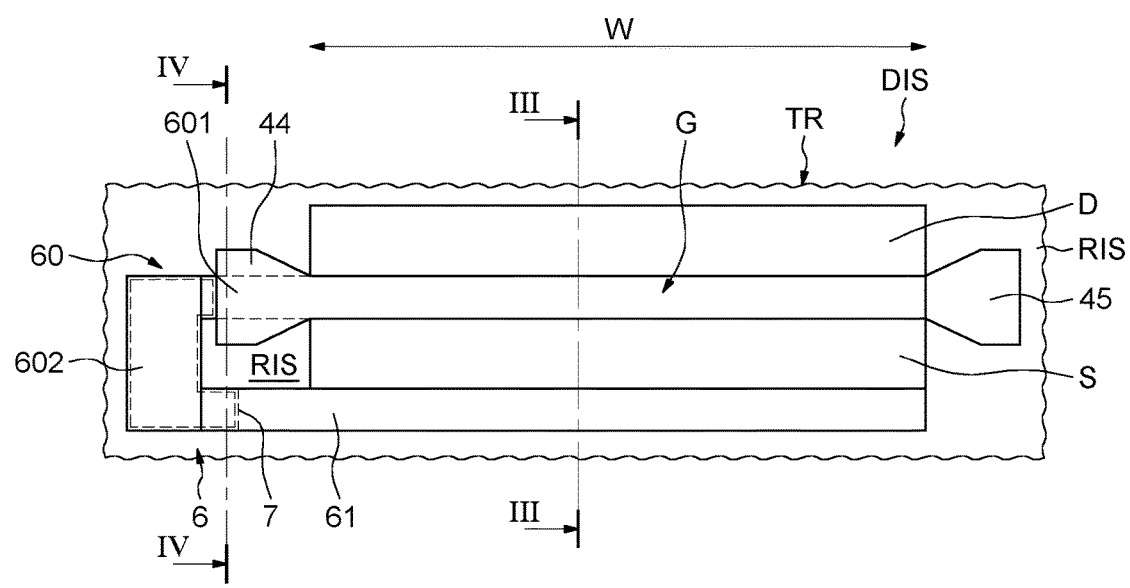
FIGS. 2, 3, and 4 schematically illustrate a device having a transistor.
Figure 3:
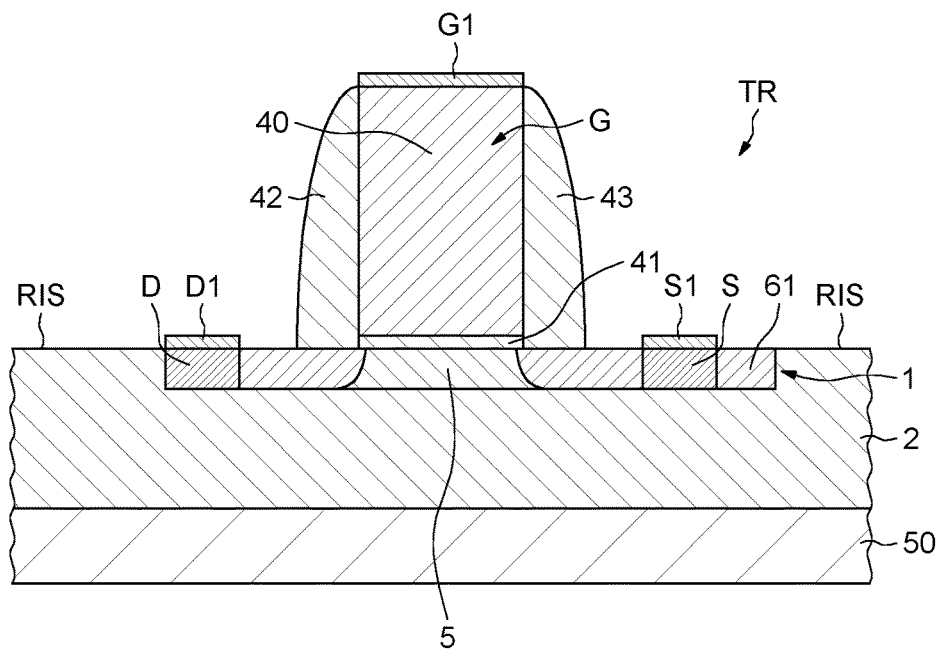
Figure 4:
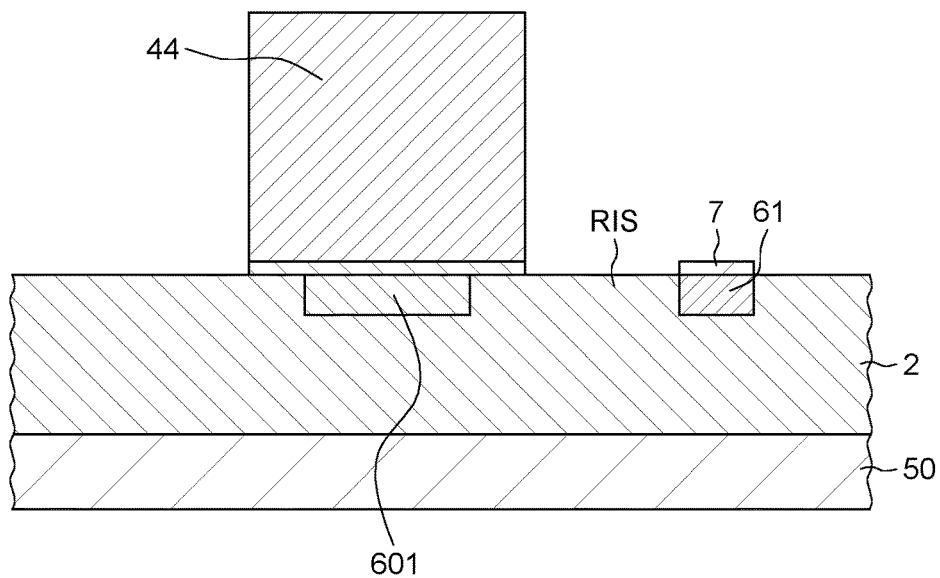

FIGS. 2, 3, and 4 schematically illustrate a device DIS having a transistor TR according to one embodiment.

FIG. 2 is a view of the transistor TR from above, FIG. 3 is a view of the transistor TR in section along the axis III-III of FIG. 2, and FIG. 4 is a view of the transistor TR in section along the axis IV-IV of FIG. 2.

The transistor TR is formed on a substrate of the partially depleted silicon on insulator type (PDSOI), which has a weakly doped semiconductor film 1, here of the p type, lying above a buried insulating layer 2 commonly referred to by the person skilled in the art by the acronym BOX (Buried Oxide), itself lying above a carrier substrate which in this case has a semiconductor body 50.

The transistor TR has, in the conventional way, a gate region G, a drain region D and a source region S, and is delimited by an insulating region RIS, for example of the shallow trench type (STI: Shallow Trench Isolation).

The source S and drain D regions are produced by doping the silicon film on either side of the gate region G and, because the substrate is in this case of the partially depleted silicon on insulator type, by resumed epitaxy the source S and drain D regions are heavily doped with a first conductivity type, in this case a conductivity of the n+ type.

The gate region G has a polysilicon region 40 formed on an insulating gate oxide layer 41, itself formed above the semiconductor film 1.

Insulating spacers 42 and 43 (not represented in FIG. 2 for the sake of simplification) are formed on either side of the gate region G.

The gate region G extends laterally (that is to say in the direction of the width W of the channel region of the transistor) on either side of the source and drain regions of the transistor TR, so as to form a first gate head 44 and a second gate head 45. The first and second gate heads are wider than the part of the gate region G lying between the source S and the drain D. These gate heads 44 and 45 advantageously make it possible to produce contacting zones so as to bias the gate region G.

Conventionally, the upper parts S1, D1 and G1, respectively, of the source S, drain D and gate G regions are silicided so as to form contacting zones.

The transistor TR furthermore has a film region 5, which lies below the gate region and is doped with a second conductivity type, in this case a p-type conductivity. This film region 5 forms the substrate region of the transistor TR. It is in this substrate region 5 that the channel region of the transistor TR is formed.

This substrate region 5 is continued laterally by an extension region 6 which extends as far as the source region S.

The extension region 6 has a connecting part 60 of p conductivity and a border region 61 of n conductivity. The part 60 and the region 61 are in contact.

The connecting part 60 comprises a first portion 601, which extends below the first gate head 44 and beyond the first gate head 44.

The connecting part 60 also comprises a second portion 602, which extends perpendicularly from the first portion 601 and is more heavily doped than the substrate region 5 as well as the first portion 601.

The border region 61 is n-doped and extends perpendicularly from the second portion 602 so as to border, in contact, the source region S over its entire length. Thus, the source region S and the border region 61 are electrically connected (or coupled).

An electrically conductive region 7 covers the second portion 602 and partially the border region 61, so as to short-circuit the PN junction formed by the connecting part 602 and by the border region 61. This region 7 is in this case a silicided region comprising a metal silicide and has a very low resistivity, typically a resistivity of less than $5 \times 10^{-5}$ ohm-centimeters.

Furthermore, below the silicided region 7, the border region 61 and the first portion 601 are more heavily doped than the zones of this border region 61 and of the first portion 601 which lie outside the silicided region 7. This, in the conventional way, makes it possible to improve the electrical coupling.

Thus, the connecting part 60 the border region 61 are mutually electrically connected. Furthermore, since the source region S and the border region 61 are electrically connected (or coupled), biasing of the source region S by means of the contacting zone S1 also makes it possible to bias the doped substrate region 5 lying between the source S and the drain D.

It is therefore advantageously possible to bias the substrate region 5 without forming an additional contacting zone, while being compatible with advanced technologies, for example 130 nm or smaller.

Figure 5:
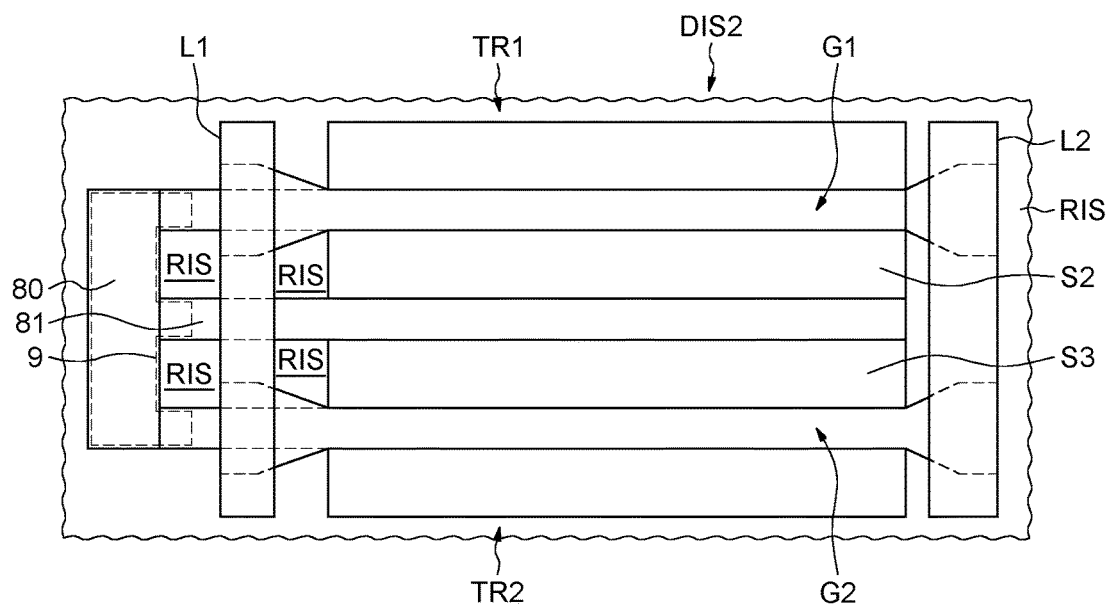
FIG. 5 schematically illustrates a device having two transistors.

FIG. 5 illustrates a device DIS2 having a first transistor TR1 and a second transistor TR2, which are similar to the transistor TR described above and illustrated by FIGS. 2 and 3.

The first transistor TR1 and the second transistor TR2 are formed side by side so as to have their source regions S2 and S3 facing one another. In this example, the gate regions of the two transistors are mutually electrically connected by means of two gate material lines L1 and L2 which extend on either side of the two transistors TR1 and TR2, perpendicularly to the gate regions above the gate heads of the two transistors.

The connecting parts of the extension regions of each of the transistors comprise a second common portion 80, which extends perpendicularly to the first portions of the connecting parts of each transistor between the two transistors TR1 and TR2.

The two transistors TR1 and TR2 also have a common border region 81, which extends from the second common portion 80 while bordering, in contact, each of the two source regions S1 and S2.

An electrically conductive region 9, in this case comprising a metal silicide of very low resistivity, is formed on the second common portion 80, partially over the common border region 81 and partially over the first portions of each transistor. This electrically conductive region 9 makes it possible to short-circuit the PN junction formed by the second common portion 80 and by the common border region 81.

Thus, the use of an extension region common to two transistors advantageously makes it possible to bias the substrate via contacts formed on the source regions, while saving on even more space.

In particular, by obviating the production of a conventional substrate contacting zone, the routing of the interconnections is simplified and makes it possible, for example, to produce more symmetrical contacting zones on either side of the gates G1 and G2 of the transistors TR1 and TR2, for example on the two gate material lines L1 and L2 which extend perpendicularly to the gate region of each transistor.

The invention claimed is:

1. An integrated electronic device, comprising:
    a substrate of a silicon on insulator type having a semiconductor film arranged on a buried insulating layer, and
    at least one transistor arranged in and on the semiconductor film,
    wherein said at least one transistor includes:
        a drain region and a source region of a first conductivity type,
        a film region of a second conductivity type and lying under a gate region of said at least one transistor,
        contacting zones on the source, gate and drain regions, and
        an extension region laterally continuing the film region beyond the source and drain regions and bordering, in contact with, the source region by a border region having the first conductivity type so as to electrically couple the source region and the film region.

2. The device according to claim 1, wherein the extension region comprises a connecting part of a same conductivity type as the film region that connects the film region to the border region, and an electrically conductive region at least partially covering the film region and the connecting part.

3. The device according to claim 2, wherein the electrically conductive region comprises a metal silicide having a resistivity of less than $5 \times 10^{-5}$ ohm-centimeters.

4. The device according to claim 2, wherein the connecting part has a first portion laterally continuing the film region and a second portion extending perpendicularly to the first portion and contacting the border region.

5. The device according to claim 4, wherein said at least one transistor comprises a pair of transistors, wherein a second portion of the connecting part of each transistor of said pair of transistors extending towards one another from the respective first portion so as to form a common second connecting portion, the device further comprising a common border region between transistors of said pair of transistors, said common border region extending from the common second connecting portion and bordering, in contact, the source region of each transistor of the pair of transistors so as to electrically couple the source region of each transistor of the pair of transistors and the film region of each transistor of the pair of transistors.

6. The device according to claim 1, wherein said at least one transistor comprises a pair of transistors, where the gate region of each transistor of the pair of transistors is mutually electrically coupled by a gate material line extending perpendicularly to the gate regions of the transistors.

7. The device according to claim 1, wherein said at least one transistor comprises a pair of transistors, where the gate region of each transistor of the pair of transistors is mutually electrically coupled by a pair of gate material lines extending perpendicularly to the gate regions of the transistors, said pair of gate materials lines being located on opposite sides of each transistor.

8. The device according to claim 1, wherein the substrate is of a partially depleted silicon on insulator type.

9. An integrated electronic device, comprising:
    a transistor having a source region, a drain region and a body region within a semiconductor layer of a silicon on insulator (SOI) substrate, said body region positioned between the source region and drain region with a first side of the source region facing said body region,
    a border region within said semiconductor layer and in contact with the source region, with a second side of the source region, opposite to said first side, facing said border region; and
    a connecting region within said semiconductor layer in contact at a first end with the body region and further in contact at a second end with the border region;
    wherein said source region and border region are doped with a first conductivity type and said body region and connecting region are doped with a second conductivity type; and
    an electrical connection in contact with both at least a portion of the connecting region and at least a portion of the border region.

10. The device of claim 9, wherein the portion of the connecting region is more heavily doped than the body region.

11. The device of claim 9, wherein the portion of the border region is more heavily doped than a remaining portion of the border region adjacent the source region.

12. The device of claim 9, wherein the electrical connection is a metal silicide having a resistivity of less than $5 \times 10^{-5}$ ohm-centimeters.

13. The device of claim 9, wherein said body region, source region and border region have longer sides extending parallel to each other in a first direction, and wherein said connecting region has a longer side extending in a second direction perpendicular to said first direction.

14. An integrated electronic device, comprising:
    a first transistor having a first source region, a first drain region and a first body region within a semiconductor layer of a silicon on insulator (SOI) substrate, said first body region positioned between the first source region and first drain region with a first side of the first source region facing said first body region,
    a second transistor having a second source region, a second drain region and a second body region within the SOI substrate, said second body region positioned between the second source region and second drain region with a first side of the second source region facing said second body region, a border region within said semiconductor layer and in contact each of the first and second source regions, with a second side of each of the first and second source regions, opposite to said first sides, facing said border region; and a connecting region within said semiconductor layer in contact at a first end with the first body region, in contact at a second end with the second body and further in contact at a middle with the border region;

wherein said first and second source regions and said border region are doped with a first conductivity type and said first and second body regions and connecting region are doped with a second conductivity type; and an electrical connection in contact with both at least a portion of the connecting region and at least a portion of the border region.

15. The device of claim 14, wherein the portion of the connecting region is more heavily doped than the first and second body regions.

16. The device of claim 14, wherein the portion of the border region is more heavily doped than a remaining portion of the border region adjacent the first and second source regions.

17. The device of claim 14, wherein the electrical connection is a metal silicide having a resistivity of less than $5 \times 10^{-5}$ ohm-centimeters.

18. The device of claim 14, wherein said first and second body regions, first and second source regions and border region have longer sides extending parallel to each other in a first direction, and wherein said connecting region has a longer side extending in a second direction perpendicular to said first direction.

* * * * *